United States Patent [19]

Masuda

[11] 4,053,791
[45] Oct. 11, 1977

[54] LOGIC CIRCUIT OF RATIOLESS STRUCTURE

[75] Inventor: Kenzo Masuda, Tokorozawa, Japan

[73] Assignee: Hitachi, Ltd., Japan

[21] Appl. No.: 698,520

[22] Filed: June 22, 1976

[30] Foreign Application Priority Data

June 23, 1975 Japan .................................. 50-75599

[51] Int. Cl.² ........................................... H03K 19/08
[52] U.S. Cl. ...................................... 307/205; 307/208
[58] Field of Search ............... 307/205, 208, 214, 304; 330/35

[56] References Cited

U.S. PATENT DOCUMENTS

| | | | |
|---|---|---|---|
| 3,497,715 | 2/1970 | Yen | 307/304 X |
| 3,524,077 | 8/1970 | Kaufman | 307/205 X |
| 3,617,767 | 11/1971 | Booher | 307/205 |
| 3,676,709 | 7/1972 | Ducamus et al. | 307/208 |

OTHER PUBLICATIONS

Terman — IBM Tech. Disclosure Bul., vol. 12, No. 3, Aug. 1969, "Three-Phase Shift Register".

Primary Examiner—John S. Heyman
Attorney, Agent, or Firm—Craig & Antonelli

[57] ABSTRACT

A logic circuit of a ratioless structure, wherein a load MOS FET, a drive MOS FET and a pre-discharge MOS FET are connected in series in the described order, a first clock is applied to the pre-discharge MOS FET, a second clock is applied to the load MOS FET, and an input signal is applied to the drive MOS FET while an output signal is derived from the junction between the drive MOS FET and pre-discharge MOS FET.

3 Claims, 3 Drawing Figures

LOGIC CIRCUIT OF RATIOLESS STRUCTURE

This invention relates to a logic circuit of a ratioless structure.

Heretofore, an input has been applied to a logic circuit of a ratioless structure directly or through two D.C.-drive MOS inverter stages. In the former case, the amplitude of the input signal must be smaller than the threshold voltage $V_{th}$ of the circuit or it must be about 1.2 volts or less in order that the circuit holds its former state even after reception of the input signal. Therefore, the direct application of the input signal to the ratioless structure logic circuit has been defective in that the noise margin of the circuit is reduced, that is, the immunity of the circuit to noise is rather low. On the other hand, the latter case, that is, the application of the input signal to the ratioless structure logic circuit through the inverter stages, has also been defective in that the power consumption is increased.

It is therefore an object of the present invention to obviate the prior art defects pointed out above and to provide a logic circuit which can operate with the least possibility of malfunction.

Other objects and advantages of the present invention will become apparent from the following description of preferred embodiments of the present invention taken in conjunction with the accompanying drawing, in which.

Figure 1:
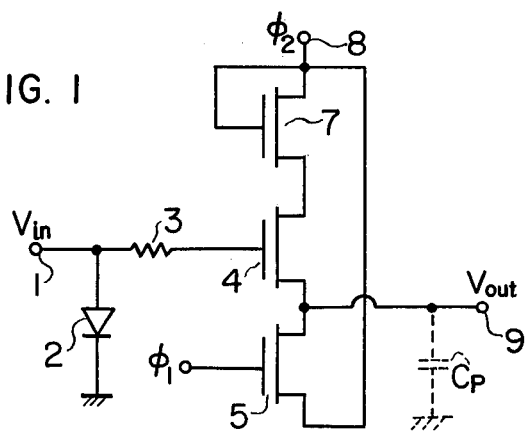
FIG. 1 is a circuit diagram of a preferred embodiment of the logic circuit according to the present invention.

Referring to FIG. 1 showing a preferred embodiment of the ratioless structure logic circuit in semiconductor integrated circuit form according to the present invention, an input terminal 1 is connected to the anode of a protective diode 2 and to one end of a protective resistor 3. The diode 2 is grounded at its cathode, and the other end of the resistor 3 is connected to the gate of a drive MOS FET 4. The source of this MOS FET 4 is connected to the drain of a pre-discharge MOS FET 5 which has its gate connected to a first clock pulse signal input terminal 6. A load MOS FET 7 has its source connected to the drain of the drive MOS FET 4 and its drain and gate connected to a second clock pulse signal input terminal 8 together with the source of the pre-discharge MOS FET 5. The source of the drive MOS FET 4 is connected to an output terminal 9.

Figure 2:
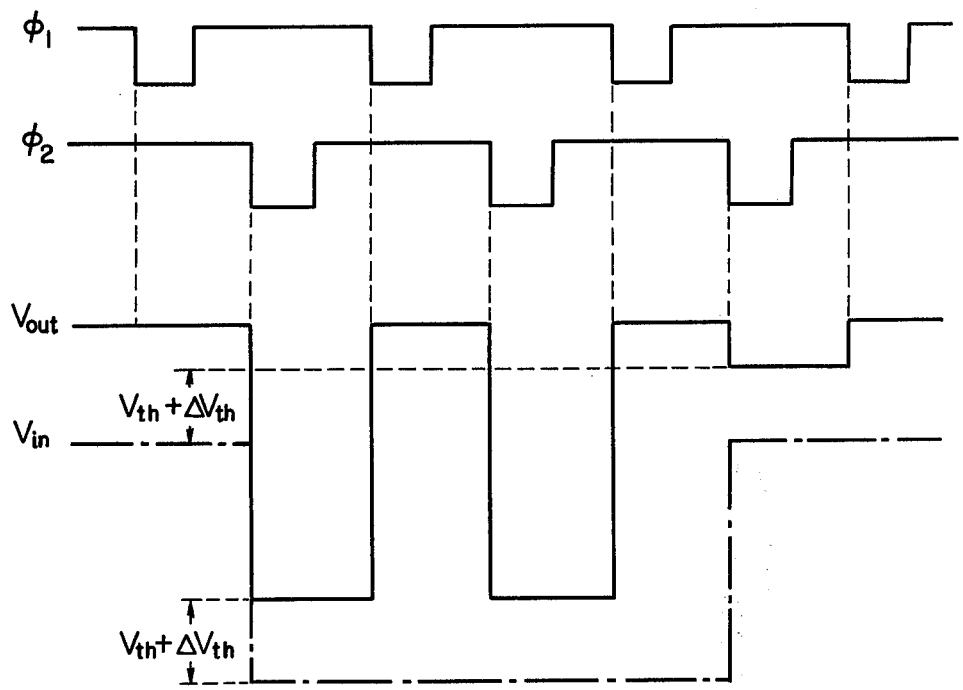
FIG. 2 shows signal waveforms appearing at various parts of the embodiment shown in FIG. 1.

Reference is now made also to FIG. 2. Suppose now that a first clock pulse signal $\phi_1$ having a waveform as shown in FIG. 2 is applied to the gate of the pre-discharge MOS FET 5 through the first clock pulse signal input terminal 6. In response to the application of the clock pulse signal $\phi_1$, pre-discharge of charges accumulated in the capacitance Cp at the output terminal 9 occurs, and the potential $V_{out}$ of the output terminal 9 is at the ground level (at the high level in this embodiment).

Suppose then that a second clock pulse signal $\phi_2$ having a waveform shown in FIG. 2 is applied to the source of the pre-discharge MOS FET 5 and to the drain and gate of the load MOS FET 7 through the second clock pulse signal input terminal 8 in the state in which no input signal is applied to the input terminal 1 and the drive MOS FET 4 is non-conducting. In response to the application of the pulse signal $\phi_2$, the potential $V_{out}$ of the output terminal 9 continues to be at the high level.

Suppose further that an input signal $V_{in}$ as shown in FIG. 2 is applied to the input terminal 1 to render the drive MOS FET 4 conducting at the time at which the clock pulse signal $\phi_2$ is applied to the second clock pulse signal input terminal 8. In such a case, the potential $V_{out}$ of the output terminal 9 is now at the low level as shown in FIG. 2.

It is to be noted in this connection that the value of the input voltage $V_{in}$ must be larger than $(2V_{th} + \Delta V_{th})$ in order to charge the output capacitance Cp at the output terminal 9 to a voltage higher than a predetermined threshold voltage $V_{th}$, and that the voltage to which the output capacitance Cp at the output terminal 9 is charged is lower than the threshold voltage $V_{th}$ and is treated as a high level signal by a succeeding ratioless structure logic circuit of semiconductor integrated circuit form when the value of the input voltage $V_{in}$ is smaller than $(2V_{th} + \Delta V_{th})$. "$\Delta V_{th}$" means an increment of the threshold voltage $V_{th}$ caused by the effect of the back-gate bias. (See in this respect "MOS FET in Circuit Design" McGraw-Hill Book Company page 44.) In other words, the ratioless structure logic circuit receives an input signal $V_{in}$ as a high level output producing signal when the value of the input signal $V_{in}$ is smaller than $(2V_{th} + \Delta V_{th})$. Therefore, the critical threshold voltage for the circuit is modified and the threshold voltage $V_{TH}$ of the input section of its associated semiconductor integrated circuit structure can be substantially increased. Consequently, the noise margin or the immunity to noise can also be improved.

Figure 3:
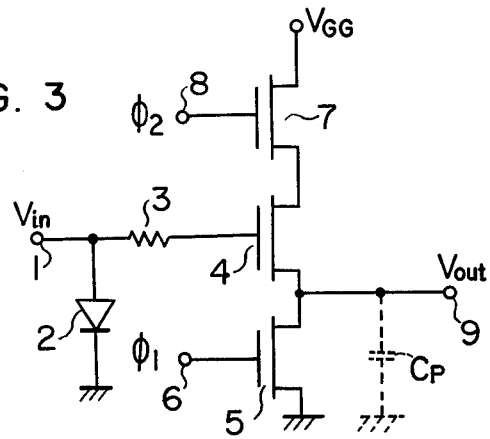
FIG. 3 is a view similar to FIG. 1 and showing another preferred embodiment of the present invention.

FIG. 3 shows another preferred embodiment of the ratioless structure logic circuit according to the present invention. In FIG. 3, the same reference numerals are used to denote the same parts appearing in FIG. 1, and therefore, any description as to such parts would be unnecessary. In the second preferred embodiment, the pre-discharge MOS FET 5 is grounded at its source, and a d-c power supply voltage $V_{GG}$ is applied to the drain of the load MOS FET 7. It is apparent that the function of this second embodiment is entirely similar to that of the first embodiment.

It will be understood from the foregoing description that the ratioless structure logic circuit of the present invention functioning as an input section of a semiconductor integrated circuit comprises a pre-discharge MOS FET, a load MOS FET, and a drive MOS FET so as to provide a modified first (high or low) potential at the output terminal. The present invention is advantageous among others in that the threshold voltage of the input section of its associated semiconductor integrated circuit device can be substantially increased to improve the noise margin, and therefore, malfunction of the input section of the device can be substantially obviated.

I claim:

1. A logic circuit of a ratioless structure comprising:
   an input terminal;
   a drive MOS FET having its gate connected to said input terminal;
   a pre-discharge MOS FET having its drain connected to the source of said drive MOS FET and its gate arranged for reception of a first clock pulse signal which causes a pre-discharge of charges accumulated at the drain of said pre-discharge MOS FET;

a load MOS FET having its source connected to the drain of said drive MOS FET and its gate arranged for reception of a second clock pulse signal; and an output terminal connected to the junction between the source of said drive MOS FET and the drain of said pre-discharge MOS FET.

2. A logic circuit according to claim 1, in which said load MOS FET has its gate and drain connected to the source of said pre-discharge MOS FET.

3. A logic circuit according to claim 1, in which the drain of said load MOS FET is connected to a bias source while the source of said pre-discharge MOS FET is connected to a common potential source.

* * * * *